United States Patent
Liu

(10) Patent No.: US 9,684,217 B2
(45) Date of Patent: Jun. 20, 2017

(54) ARRAY SUBSTRATE, METHOD FOR MANUFACTURING THE SAME AND LIQUID CRYSTAL DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/771,694

(22) PCT Filed: Jan. 4, 2015

(86) PCT No.: PCT/CN2015/070024
§ 371 (c)(1),
(2) Date: Aug. 31, 2015

(87) PCT Pub. No.: WO2016/045238
PCT Pub. Date: Mar. 31, 2016

(65) Prior Publication Data
US 2017/0003529 A1 Jan. 5, 2017

(30) Foreign Application Priority Data

Sep. 22, 2014 (CN) .......................... 2014 1 0486673

(51) Int. Cl.
*G02F 1/1368* (2006.01)
*H01L 21/467* (2006.01)
(Continued)

(52) U.S. Cl.
CPC .......... *G02F 1/1368* (2013.01); *G02F 1/1362* (2013.01); *G02F 1/136227* (2013.01);
(Continued)

(58) Field of Classification Search
CPC ........... H01L 29/4908; H01L 29/78603; H01L 29/78606; H01L 29/7869; H01L 29/66969;
(Continued)

(56) References Cited

U.S. PATENT DOCUMENTS

2008/0018850 A1* 1/2008 Shih ...................... H01L 21/268
349/152
2016/0027804 A1* 1/2016 Li .......................... H01L 27/127
257/43

FOREIGN PATENT DOCUMENTS

| CN | 1507656 A | 6/2004 |
|----|-----------|--------|
| CN | 1737883 A | 2/2006 |

(Continued)

OTHER PUBLICATIONS

First Office Action regarding Chinese application No. 201410486673.2, dated Sep. 21, 2016. Translation provided by Dragon Intellectual Property Law Firm.
(Continued)

*Primary Examiner* — Benjamin Sandvik
*Assistant Examiner* — Changhyun Yi
(74) *Attorney, Agent, or Firm* — Harness, Dickey & Pierce, P.L.C.

(57) ABSTRACT

An array substrate, a method for manufacturing the same and a liquid crystal display device are provided. A metal oxide semiconductor layer and an etching stop layer are sequentially formed on a gate insulating layer. One patterning process is performed in the etching stop layer to form a source electrode contact region via hole, a drain electrode contact region via hole and an insulation region. A source-drain electrode layer is formed on the etching stop layer. During a process of performing one patterning process in the source-drain electrode layer to form a source-drain electrode pattern, a portion of the metal oxide semiconductor layer
(Continued)

corresponding to the insulation region is removed so that the metal oxide semiconductor layer is disconnected at a position corresponding to the insulation region. The insulation region surrounds the source-drain electrode pattern.

10 Claims, 2 Drawing Sheets

(51) Int. Cl.
    *H01L 27/12*     (2006.01)
    *G02F 1/1362*     (2006.01)
    *H01L 29/786*     (2006.01)
    *H01L 21/77*     (2017.01)

(52) U.S. Cl.
    CPC ............ *H01L 21/467* (2013.01); *H01L 21/77* (2013.01); *H01L 27/12* (2013.01); *H01L 27/127* (2013.01); *H01L 27/1225* (2013.01); *H01L 29/7869* (2013.01); *H01L 29/78606* (2013.01)

(58) Field of Classification Search
    CPC ........... H01L 27/3262; H01L 29/78693; H01L 27/1251; G02F 1/1368; G02F 1/136227
    USPC ................................ 257/42, 43, 54; 438/104
    See application file for complete search history.

(56) References Cited

FOREIGN PATENT DOCUMENTS

| CN | 101950733 A | 1/2011 |
|----|-------------|--------|
| CN | 102543867 A | 7/2012 |
| CN | 102651340 A | 8/2012 |
| CN | 102651401 A | 8/2012 |
| CN | 102709239 A | 10/2012 |
| CN | 102709328 A | 10/2012 |
| CN | 102945828 A | 2/2013 |
| CN | 103715266 A | 4/2014 |
| CN | 103928470 A | 7/2014 |
| CN | 104051472 A | 9/2014 |

OTHER PUBLICATIONS

Written Opinion of the International Searching Authority for international application No. PCT/CN2015/070024.

Second Office Action regarding Chinese Application No. 201410486673.2, dated Mar. 9, 2017. Translation provided by Dragon Intellectual Property Law Firm.

* cited by examiner

ARRAY SUBSTRATE, METHOD FOR MANUFACTURING THE SAME AND LIQUID CRYSTAL DISPLAY DEVICE

CROSS-REFERENCE TO RELATED APPLICATION

This application is the U.S. national phase of PCT Application No. PCT/CN2015/070024 filed on Jan. 4, 2015, which claims a priority to Chinese Patent Application No. 201410486673.2 filed on Sep. 22, 2014, the disclosure of which is incorporated in its entirety by reference herein.

TECHNICAL FIELD

The present disclosure relates to the field of display technology, and in particular to an array substrate, a method for manufacturing the same and a liquid crystal display device.

BACKGROUND

With the development of science and technology, flat panel display monitors have replaced bulky CRT monitors and deeply embedded into people's daily routines. At present, common flat panel display monitors include liquid crystal display (LCD) and organic light-emitting diode display. Particularly, the LCD flat panel display has been rapidly developed in recent years and dominated the current flat-panel display market due to its characteristics such as small size, light weight, thin, low power consumption and no radiation, and has been widely used in products of various sizes, which almost cover main electronic products in today's information society, such as LCD TVs, computers, cell phones, PDA, GPS, vehicle display, projection display, video cameras, digital cameras, electronic watches, calculators, electronic equipment, instruments, public display and unreal display.

In an imaging process, in cooperation with a periphery driving circuit, each liquid crystal pixel in the LCD monitor is driven by a thin film transistor (TFT) integrated in a TFT array substrate to realize displaying of images. In an active matrix organic light emission display (OLED), in cooperation with a periphery driving circuit, TFT in a TFT array substrate drives a corresponding OLED pixel of the OLED panel to realize displaying of images. In the above display, TFT is a switch for controlling light emission, is a key for realizing a large-size LCD display and OLED display, and directly affects development direction of high performance flat panel display.

In the existing production technology of flat panel display monitors, industrial TFT mainly includes amorphous silicon TFT, poly-silicon TFT, and mono-crystalline silicon TFT, etc. Most of array substrates in the flat panel display monitors are manufactured by adopting amorphous silicon TFT. At present, with the development of technology, the metal oxide TFT appears. The metal oxide TFT has advantages of high carrier mobility, thus, TFT can be made in a smaller size, thereby to enable the flat panel display monitor to have a higher resolution and better display effect. In addition, the metal oxide TFT has further advantages such as less characteristic inequality, material and process of low cost, low process temperature, capable of being used in coating process, high transparency, large band gap. Therefore, application of the metal oxide TFT in the flat panel display monitor receives much concern.

At present, generally six times of lithography process are adopted to manufacture the metal oxide TFT, this mainly because a metal oxide semiconductor layer may be corroded when etching source and drain metal electrodes and thus an etching stop layer is added on the metal oxide semiconductor layer to prevent the metal oxide semiconductor layer from being corroded by etching liquid when etching the source and drain metal electrodes. Generally, the fewer the mask plates used when manufacturing the metal oxide TFT, the higher the production efficiency and the lower the cost.

SUMMARY

The present disclosure provides an array substrate, a method for manufacturing the same and a liquid crystal display device, so as to solve problems such as low production efficiency and high cost existed in the existing process of manufacturing a metal oxide TFT.

A method for manufacturing an array substrate includes following steps: step 101, sequentially forming a metal oxide semiconductor layer and an etching stop layer on a gate insulating layer; step 102, performing one patterning process in the etching stop layer to form a source electrode contact region via hole, a drain electrode contact region via hole and an insulation region; step 103, forming a source-drain electrode layer on the etching stop layer obtained in the step 102; step 104, during a process of performing one patterning process in the source-drain electrode layer to form a source-drain electrode pattern, removing a portion of the metal oxide semiconductor layer corresponding to the insulation region so that the metal oxide semiconductor layer is disconnected at a position corresponding to the insulation region; wherein the insulation region surrounds the source-drain electrode pattern.

The present disclosure further provides an array substrate, including: a gate electrode and a gate insulating layer which are sequentially formed on a base substrate; a metal oxide semiconductor layer and an etching stop layer sequentially formed on the gate insulating layer; a source-drain electrode layer formed on the etching stop layer; wherein an insulation region surrounding a source-drain electrode pattern is formed in the etching stop layer; the metal oxide semiconductor layer is disconnected at a position corresponding to the insulation region.

The present disclosure further provides a display device including the above array substrate.

Beneficial effects of the present disclosure are as follow. According to the method for manufacturing array substrates of one embodiment of the present disclosure, after completion of forming the metal oxide semiconductor layer on the gate insulating layer, the etching stop layer is directly formed on the metal oxide semiconductor layer. That is, before the etching stop layer is formed, the metal oxide semiconductor layer is not etched, this helps to form a good interface between the metal oxide semiconductor layer and the etching stop layer. Further, according to one embodiment of the present disclosure, the source electrode contact region via hole, the drain electrode contact region via hole and the insulation region surrounding the source-drain electrode pattern to be formed are formed by performing the patterning process in the etching stop layer; then, during the process of performing one patterning process in the source-drain electrode layer to form the source-drain electrode pattern, the portion of the metal oxide semiconductor layer corresponding to the insulation region is removed through one patterning process, so that the metal oxide semiconductor layer is disconnected at the position corresponding to the insulation region. According to the method for manufacturing array substrates of one embodiment of the present disclosure, it only needs to remove the portion of the metal oxide semiconductor layer corresponding to the insulation region, thereby avoiding the waste of resources caused by etching the etching stop layer in large area.

Therefore, the method for manufacturing array substrates of one embodiment of the present disclosure can not only reduce one time of lithography process, but also avoid etching the etching stop layer in large area, which helps to improve production efficiency.

DETAILED DESCRIPTION

To make technical problems to be solved, technical solutions and advantages more clearly, detailed description will be given below in conjunction the accompanying drawings and embodiments.

The present disclosure provides a method for manufacturing array substrates. The method includes following steps.

At step 101, sequentially forming a metal oxide semiconductor layer and an etching stop layer on a gate insulating layer.

At step 102, performing a first patterning process in the etching stop layer to form a source electrode contact region via hole, a drain electrode contact region via hole and an insulation region surrounding a source-drain electrode pattern to be formed.

At step 103, forming a source-drain electrode layer on the etching stop layer obtained in the step 102.

At step 104, during a process of performing one patterning process in the source-drain electrode layer to form the source-drain electrode pattern, removing a portion of the metal oxide semiconductor layer corresponding to the insulation region so that the metal oxide semiconductor layer is disconnected at a position corresponding to the insulation region.

According to the method for manufacturing array substrates of one embodiment of the present disclosure, after completion of forming the metal oxide semiconductor layer on the gate insulating layer, the etching stop layer is directly formed on the metal oxide semiconductor layer. That is, before the etching stop layer is formed, the metal oxide semiconductor layer is not etched; this helps to form a good interface between the metal oxide semiconductor layer and the etching stop layer. Further, according to one embodiment of the present disclosure, the source electrode contact region via hole, the drain electrode contact region via hole and the insulation region surrounding the source-drain electrode pattern to be formed are formed by performing the patterning process in the etching stop layer; then, during the process of performing one patterning process in the source-drain electrode layer to form the source-drain electrode pattern, the portion of the metal oxide semiconductor layer corresponding to the insulation region is removed through one patterning process, so that the metal oxide semiconductor layer is disconnected at the position corresponding to the insulation region. That is, for the etching stop layer corresponding to a region rather than the source-drain electrode pattern, according to the method for manufacturing array substrates of one embodiment of the present disclosure, it only needs to remove the portion of the metal oxide semiconductor layer corresponding to the insulation region, thereby avoiding the waste of resources caused by etching the etching stop layer in large area.

Figure 1:
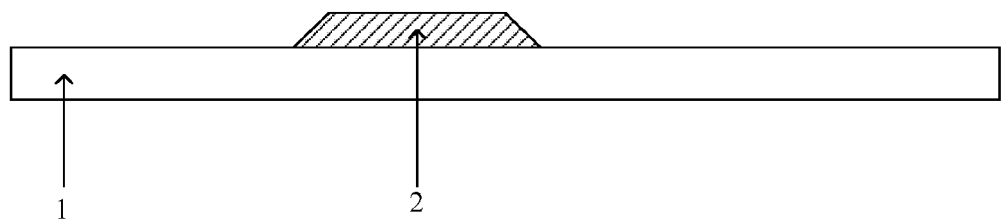
FIG. 1 is a schematic cross-sectional view of an array substrate obtained after a first patterning process according to one embodiment of the present disclosure.
Figure 2:
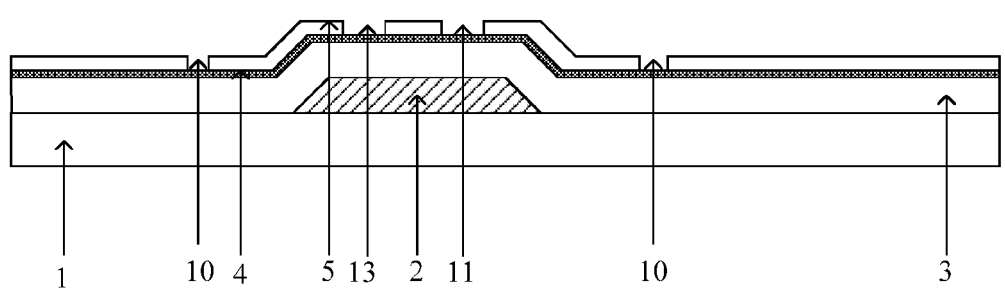
FIG. 2 is a schematic cross-sectional view of an array substrate obtained after a second patterning process according to one embodiment of the present disclosure.

Before the step 101, the method further includes a step of forming a gate electrode and the gate insulating layer on a base substrate. For example, as shown in FIGS. 1-2, a gate metal film is formed on a base substrate 1, and a gate electrode pattern is formed by performing one patterning process in the gate metal film. After the gate electrode 2 is formed, a gate insulating layer 3 is formed on the gate electrode. After the gate insulating layer 3 is formed, a metal oxide semiconductor layer 4 is formed on the gate insulating layer and an etching stop layer 5 is formed on the metal oxide semiconductor layer 4. In the existing process, before forming the etching stop layer 5, it is required to etch the metal oxide semiconductor layer 4 in advance. That is, after the metal oxide semiconductor layer 4 is formed, it is required to perform one lithography operation on the metal oxide semiconductor layer 4, and then the etching stop layer 5 is formed on the metal oxide semiconductor layer 4 which has subjected to the lithography operation. While in the technical solution of one embodiment of the present disclosure, the metal oxide semiconductor layer 4 is not etched before the etching stop layer 5 is formed, and the etching stop layer 5 is directly formed on the metal oxide semiconductor layer 4. This helps to form a good interface between the metal oxide semiconductor layer and the etching stop layer.

In the step 102, one patterning process is performed in the etching stop layer to form the source electrode contact region via hole, the drain electrode contact region via hole and the insulation region surrounding the source-drain electrode pattern to be formed. The insulation region for the source-drain electrode pattern refers to a region surrounding the source-drain electrode pattern and separated from the source-drain electrode pattern. This step may adopt etching or other patterning process performed in the etching stop layer to form the source electrode contact region via hole, the drain electrode contact region via hole and the insulation region.

In the step 103, the source-drain electrode layer is formed on the etching stop layer obtained in the step 102, and the source-drain electrode pattern is formed through one patterning process. The patterning process for forming the source-drain electrode pattern may adopt the existing etching process.

In the step 104, during the process of performing one patterning process in the source-drain electrode layer to form the source-drain electrode pattern, the metal oxide semiconductor corresponding to the insulation region is connected with the metal oxide semiconductor at other regions. This step simultaneously removes the portion of the metal oxide semiconductor layer corresponding to the insulation region through one patterning process, so that the metal oxide semiconductor layer is disconnected at the position corresponding to the insulation region.

Optionally, in the step 104, during the process of forming the source-drain electrode pattern through one patterning process, the portion of the metal oxide semiconductor layer corresponding to the insulation region is removed through source-drain electrode etching medium, so that the metal oxide semiconductor layer is disconnected at the position corresponding to the insulation region. Since a position of the metal oxide semiconductor layer corresponding to the insulation region is exposed, thus the metal oxide semiconductor at the insulation region can be removed through the source-drain electrode etching medium. As a result, the source-drain electrode pattern separated from the metal oxide semiconductor layer can be formed. For the etching stop layer corresponding to the region rather than the source-drain electrode pattern, according to the method for manufacturing array substrates of one embodiment of the present disclosure, it only needs to remove the portion of the metal oxide semiconductor layer corresponding to the insulation region, thereby avoiding the waste of resources caused by etching the etching stop layer in large area.

After the step 104, the method further includes: at step 105, forming a contact via hole pattern. That is, after making the metal oxide semiconductor layer be disconnected at the position corresponding to the insulation region, the method further includes: forming a protective layer on the source-drain electrode layer obtained in the step 104, and performing one patterning process on the protective layer to form the contact via hole pattern for connecting a pixel electrode to the drain electrode.

After the step 105, the method further includes: at step 106, forming a pixel electrode pattern. That is, after the step of forming the protective layer on the source-drain electrode layer obtained in the step 104 and performing one patterning process on the protective layer to form the contact via hole pattern for connecting the pixel electrode to the drain electrode, the method further includes: forming a conductive layer on the protective layer obtained in the step 105, and performing one patterning process on the conductive layer to form the pixel electrode pattern.

FIGS. 1-5 show flow charts of forming an array substrate, and the specific process includes following steps.

At step 1, sequentially depositing a gate metal film with a thickness of about 2000 Å~10000 Å on a base substrate through sputtering or thermal evaporation. The gate metal film may be made of metal such as Cr, W, Cu, Ti, Ta, Mo or alloy. One gate metal layer formed by a plurality of layers of metal can also meet requirements. Then, as shown in FIG. 1, a gate electrode 2 is formed after one conventional lithography process.

At step 2, continuously depositing a gate insulating layer 3 with a thickness of about 2000 Å~8000 Å on the base substrate obtained in the step 1, through plasma enhanced chemical vapor deposition (PECVD). The gate insulating layer 3 may be made of oxide, nitride or oxide nitride compounds. For example, reaction gas corresponding to silicon oxide may be $N_2O$ and $SiH_4$; reaction gas corresponding to silicon oxynitride may be $N_2O$, $SiH_4$, $NH_3$ and $N_2$; reaction gas corresponding to silicon nitride may be $SiH_4$, $NH_3$ and $N_2$ or $SiH_2Cl_2$, $NH_3$ and $N_2$. Then, a metal oxide semiconductor layer 4 with a thickness of about 100 Å~2000 Å is deposited on the gate insulating layer through sputtering or thermal evaporation. The metal oxide semiconductor layer may be made of amorphous IGZ, HIZO, IZO, a-InZnO, ZnO:F, $In_2O_3$:Sn, $In_2O_3$:Mo, $Cd_2SnO_4$, ZnO: Al, $TiO_2$:Nb, Cd—Sn—O, or other metal oxide. Then, an etching stop layer 5 with a thickness of about 500 Å~4000 Å is deposited through PECVD. The etching stop layer may be made of oxide, nitride or oxide nitride compounds. For example, reaction gas corresponding to silicon oxide may be $N_2O$ and $SiH_4$; reaction gas corresponding to silicon oxynitride may be $N_2O$, $SiH_4$, $NH_3$ and $N_2$; reaction gas corresponding to silicon nitride may be $SiH_4$, $NH_3$ and $N_2$ or $SiH_2Cl_2$, $NH_3$ and $N_2$. The etching stop layer may also be made of $Al_2O_3$, or a double-layer stop structure. Then, as shown in FIG. 2, a source electrode contact region via hole 13, a drain electrode contact region via hole 11 and an insulation region 10 surrounding the source-drain electrode pattern are formed through one conventional lithography process.

Figure 3:
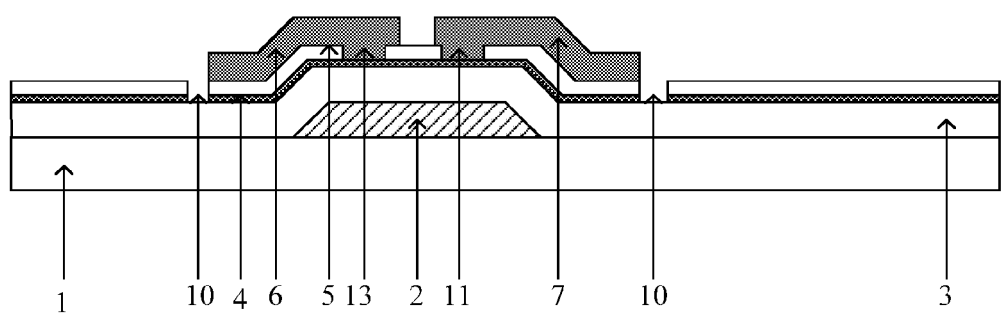
FIG. 3 is a schematic cross-sectional view of an array substrate obtained after a third patterning process according to one embodiment of the present disclosure.

At step 3, sequentially depositing a source-drain metal film with a thickness of about 2000 Å~10000 Å on the base substrate obtained in the step 2, through sputtering or thermal evaporation. The source-drain metal film may be made of metal such as Cr, W, Cu, Ti, Ta, Mo or alloy. One gate metal layer formed by a plurality of layers of metal can also meet requirements. A source electrode 6, a drain electrode 7 and a data line are formed through one conventional lithography process. When etching the source-drain metal electrode, the metal oxide semiconductor at a position corresponding to the insulation region 10 which surrounds the source-drain electrode pattern is removed through source-drain electrode etching medium, as shown in FIG. 3.

Figure 4:
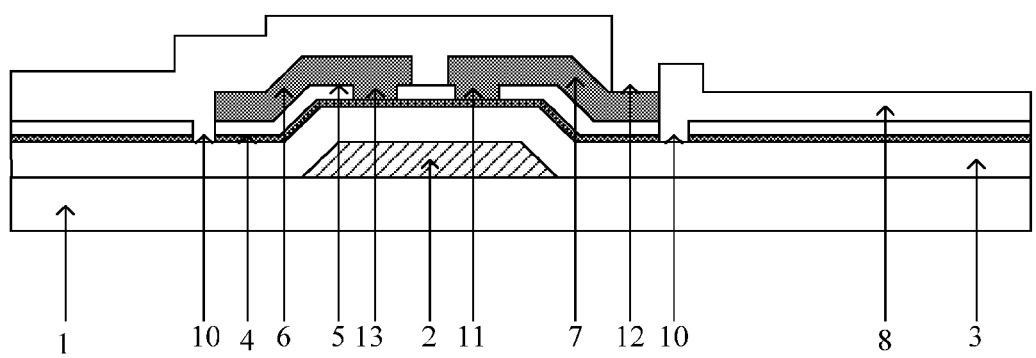
FIG. 4 is a schematic cross-sectional view of an array substrate obtained after a fourth patterning process according to one embodiment of the present disclosure.

At step 4, depositing a metal oxide protective layer 8 with a thickness of about 500 Å~3000 Å on the base substrate obtained in the step 3 through PECVD. The metal oxide protective layer 8 may be of a single layer of silicon oxide or a composite structure of silicon nitride and silicon oxide, or a triple-layered structure consisting of silicon nitride/silicon oxynitride/silicon oxide. For example, reaction gas corresponding to silicon oxide may be $N_2O$ and $SiH_4$; reaction gas corresponding to silicon oxynitride may be $N_2O$, $SiH_4$, $NH_3$ and $N_2$; reaction gas corresponding to silicon nitride may be $SiH_4$, $NH_3$ and $N_2$ or $SiH_2Cl_2$, $NH_3$ and $N_2$. Then, a protective layer is formed on the source-drain electrode layer, and a contact via hole 12 for connecting a pixel electrode to the drain electrode is formed in the protective layer by one patterning process, as shown in FIG. 4.

Figure 5:
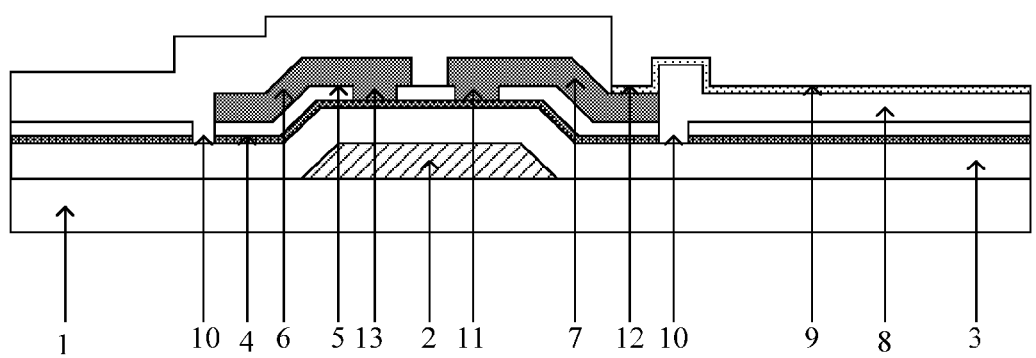
FIG. 5 is a schematic cross-sectional view of an array substrate obtained after a fifth patterning process according to one embodiment of the present disclosure.

At step 5, depositing a transparent conductive layer having a thickness of about 100 Å~2000 Å on the base substrate obtained in the step 4 through sputtering or thermal evaporation. The transparent conductive layer may be made of ITO, IZO or other transparent metal oxide. A pixel electrode 9 is formed by performing one lithography process on the transparent conductive layer, and FIG. 5 shows a cross-sectional view of the pixel electrode 9.

The technical solution of the present disclosure adopts five times of lithography process to manufacture the metal oxide TFT. By taking the pattern of the source-drain electrode layer as a mask plate for the transparent metal oxide semiconductor layer to form a semiconductor layer pattern as well as cleverly-designed structures of the TFT, one time of lithography process is reduced when comparing with using a common mask plate. Such a design can not only reduce one time of lithography process, but also avoid etching the etching stop layer in large area, which helps to improve production efficiency. According to one embodiment of the present disclosure, the etching stop layer is directly deposited on the metal oxide semiconductor layer, this helps to form a good interface and improve performance of the metal oxide semiconductor layer.

The present disclosure further provides an array substrate, including: a gate electrode and a gate insulating layer which are sequentially formed on a base substrate; a metal oxide semiconductor layer and an etching stop layer sequentially formed on the gate insulating layer; a source-drain electrode layer formed on the etching stop layer.

An insulation region surrounding a source-drain electrode pattern is formed in the etching stop layer. The metal oxide semiconductor layer is disconnected at a position corresponding to the insulation region.

Optionally, a protective layer is formed on the source-drain electrode layer; a contact via hole pattern for connecting a pixel electrode to the drain electrode is defined in the protective layer.

Optionally, a data line is further formed on the etching stop layer. The data line is connected with a drain electrode of the source-drain electrode pattern.

The present disclosure further provides a display device including the above array substrate. The display device can adopt any array substrate of the above embodiments. The display device may be any product or component having display function such as a liquid crystal panel, an electric paper, an OLED panel, a mobile phone, a tablet computer, a television, a monitor, a notebook computer, a digital photo frame.

By using the above technical solution to manufacture the array substrate, the metal oxide semiconductor at the insulation region is removed through the source-drain electrode etching medium and thus one time of lithography process is reduced. Further, for the etching stop layer corresponding to a region rather than the source-drain electrode pattern, according to the method for manufacturing array substrates of one embodiment of the present disclosure, it only needs to remove the portion of the metal oxide semiconductor layer corresponding to the insulation region, thereby avoiding the waste of resources caused by etching the etching stop layer in large area.

The above are merely optional embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing an array substrate comprising:
   step 101, sequentially forming a metal oxide semiconductor layer and an etching stop layer on a gate insulating layer;
   step 102, performing one patterning process in the etching stop layer to form a source electrode contact region via hole, a drain electrode contact region via hole and an insulation region;
   step 103, forming a source-drain electrode layer on the etching stop layer obtained in the step 102; and
   step 104, during a process of performing one patterning process in the source-drain electrode layer to form a source-drain electrode pattern, removing a portion of the metal oxide semiconductor layer corresponding to the insulation region so that the metal oxide semiconductor layer is disconnected at a position corresponding to the insulation region,
   wherein the insulation region surrounds the source-drain electrode pattern.

2. The method according to claim 1, wherein during the process of performing one patterning process in the source-drain electrode layer to form the source-drain electrode pattern, removing the portion of the metal oxide semiconductor layer corresponding to the insulation region through source-drain electrode etching medium.

3. The method according to claim 1, wherein before the step of sequentially forming the metal oxide semiconductor layer and the etching stop layer on the gate insulating layer, the method further comprises:
   forming a gate metal film on a base substrate, and forming a gate electrode pattern by performing one patterning process in the gate metal film;
   forming the gate insulating layer on the gate electrode;
   forming the metal oxide semiconductor layer on the gate insulating layer; and
   forming the etching stop layer on the metal oxide semiconductor layer.

4. The method according to claim 1, wherein the step of forming the source-drain electrode layer further comprises:
   forming a metal film on the etching stop layer obtained in the step 102, and performing one patterning process on the metal film to form a source electrode pattern, a drain electrode pattern and a data line pattern.

5. The method according to claim 1, wherein after completing the step 104, the method further includes:
   step 105, forming a protective layer on the source-drain electrode layer obtained in the step 104, and performing one patterning process on the protective layer to form a contact via hole pattern for connecting a pixel electrode to the drain electrode.

6. The method according to claim 5, wherein after completing the step 104, the method further includes:
   step 106, forming a conductive layer on the protective layer obtained in the step 105, and performing one patterning process on the conductive layer to form a pixel electrode pattern.

7. An array substrate comprising:
   a gate electrode and a gate insulating layer sequentially formed on a base substrate;
   a metal oxide semiconductor layer and an etching stop layer sequentially formed on the gate insulating layer;
   a source-drain electrode layer formed on the etching stop layer;
   wherein a portion of the etching stop layer is removed to form an insulation region surrounding a source-drain electrode pattern, and
   a portion of the metal oxide semiconductor layer corresponding to the insulation region is removed so that the metal oxide semiconductor layer is disconnected at a position corresponding to the insulation region.

8. The array substrate according to claim 7, wherein a protective layer is formed on the source-drain electrode layer; a contact via hole pattern for connecting a pixel electrode to a drain electrode is defined in the protective layer.

9. The array substrate according to claim 7, wherein a data line is further formed on the etching stop layer; the data line is connected with a drain electrode of the source-drain electrode pattern.

10. A display device comprising the array substrate according to claim 7.

* * * * *